US012677634B2

(12) United States Patent
Chuang et al.

(10) Patent No.: US 12,677,634 B2
(45) Date of Patent: Jul. 7, 2026

(54) WAFER NOTCH POSITIONING DETECTION

(71) Applicant: Taiwan Semiconductor Manufacturing Company, Ltd., Hsinchu (TW)

(72) Inventors: Kai-An Chuang, Miaoli (TW); Kuang-Wei Hsueh, Zhubei City (TW); Shih-Huan Chen, Zhubei City (TW); Yung-Shu Kao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 113 days.

(21) Appl. No.: 18/581,722

(22) Filed: Feb. 20, 2024

(65) Prior Publication Data

US 2024/0194513 A1 Jun. 13, 2024

Related U.S. Application Data

(63) Continuation of application No. 18/060,981, filed on Dec. 2, 2022, now Pat. No. 11,942,348, which is a
(Continued)

(51) Int. Cl.
H01L 21/68 (2006.01)
G01B 7/31 (2006.01)
H10P 72/50 (2026.01)

(52) U.S. Cl.
CPC ............... H10P 72/53 (2026.01); G01B 7/31 (2013.01); H10P 72/57 (2026.01)

(58) Field of Classification Search
CPC ................. H01L 21/681; H01L 21/682; H01L 21/67259; H01L 21/67167; H01L 22/12;
(Continued)

(56) References Cited

U.S. PATENT DOCUMENTS 5,438,209 A * 8/1995 Yamamoto .............. H10P 72/53
250/548
5,563,798 A * 10/1996 Berken .................. H01L 21/681
414/935
(Continued)

FOREIGN PATENT DOCUMENTS

CN 1505097 A 6/2004
CN 110459499 A 11/2019
(Continued)

OTHER PUBLICATIONS

Taiwan Office Action issued in Application No. 11021188560, dated Dec. 2, 2021, 3 pages.

*Primary Examiner* — Michelle M Iacoletti
*Assistant Examiner* — Maher Yazback
(74) *Attorney, Agent, or Firm* — Harrity & Harrity, LLP

(57) ABSTRACT

An optical system may include a light source to provide a beam of light. The optical system may include a reflector to receive and redirect the beam of light. The optical system may include a light gate having an opening to permit the beam of light, from the reflector, to travel through the opening. The optical system may include a light sensor to receive a portion of the beam of light after the beam of light travels through the opening, and convert the portion of the beam of light to a signal. The optical system may include a processing device to determine whether a notch of a wafer is in an allowable position based on the signal.

20 Claims, 7 Drawing Sheets

200

Related U.S. Application Data continuation of application No. 16/947,850, filed on Aug. 20, 2020, now Pat. No. 11,521,882.

(58) Field of Classification Search
CPC ........ H01L 23/544; H01L 2223/54493; G01B 7/31; G01V 8/14; G01D 5/342
USPC .......................................................... 356/614
See application file for complete search history.

(56) References Cited

U.S. PATENT DOCUMENTS

| | | | |
|---|---|---|---|
| 11,521,882 B2 | 12/2022 | Chuang et al. | |
| 2002/0127951 A1 | 9/2002 | Ishikawa et al. | |
| 2003/0003608 A1 | 1/2003 | Arikado et al. | |
| 2003/0081188 A1 | 5/2003 | Suzuki | |
| 2003/0160971 A1* | 8/2003 | Krause ................. | H01L 21/681 |
| | | | 356/614 |
| 2004/0056216 A1 | 3/2004 | Inenaga et al. | |
| 2005/0128490 A1* | 6/2005 | Stanke ................. | B24B 37/005 |
| | | | 356/601 |
| 2007/0139642 A1 | 6/2007 | Ikeda et al. | |
| 2012/0078561 A1 | 3/2012 | Knijn et al. | |
| 2013/0085595 A1 | 4/2013 | Kiley et al. | |
| 2013/0100441 A1 | 4/2013 | Tagawa et al. | |
| 2014/0263981 A1* | 9/2014 | Chatterjee .......... | G01N 21/8806 |
| | | | 362/253 |
| 2018/0209780 A1 | 7/2018 | Schattenburg et al. | |
| 2019/0172742 A1* | 6/2019 | Mochizuki ............ | H01L 21/681 |
| 2021/0296152 A1* | 9/2021 | Nagai ............... | H01L 21/67242 |
| 2022/0415690 A1* | 12/2022 | Tan ......................... | H10P 72/53 |
| 2023/0096018 A1 | 3/2023 | Chuang et al. | |

FOREIGN PATENT DOCUMENTS

| | | | | |
|---|---|---|---|---|
| CN | 110459499 B | 9/2021 | | |
| JP | 2000031245 A | 1/2000 | | |
| JP | 2013093389 A | 5/2013 | | |
| JP | 2015050410 A | 3/2015 | | |
| KR | 100871747 B1 | 12/2008 | | |
| TW | I283454 B | 7/2007 | | |
| TW | 200731452 A | 8/2007 | | |
| TW | I654418 B | 3/2019 | | |
| WO | WO-2006025386 A1 * | 3/2006 | .......... | H01L 21/682 |
| WO | 2009062256 A1 | 5/2009 | | |

* cited by examiner

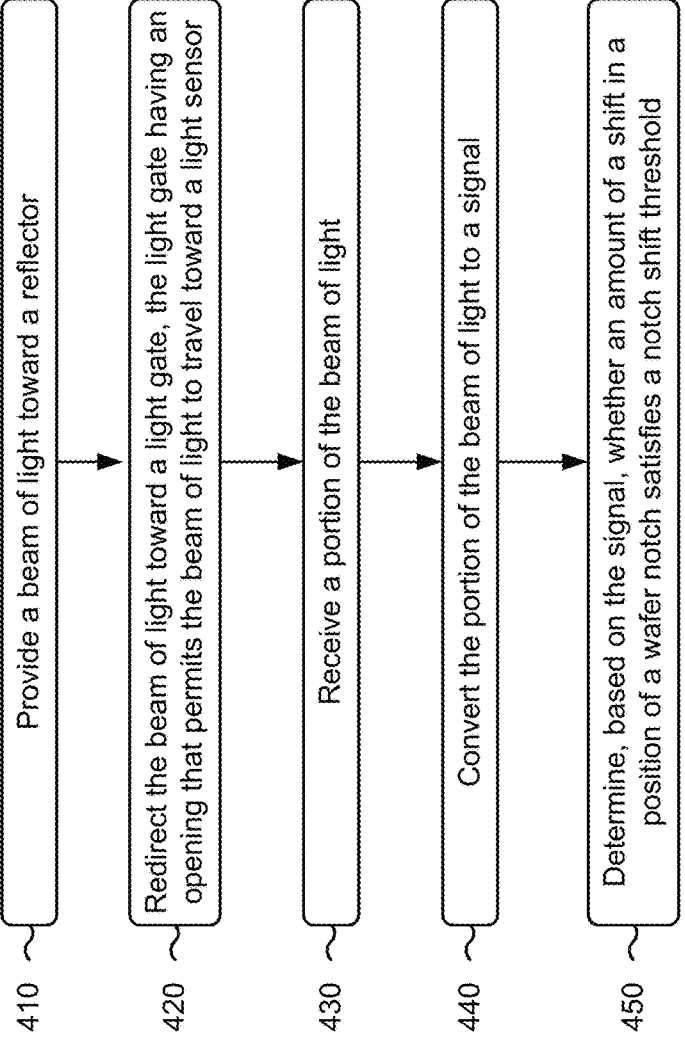

400

410 — Provide a beam of light toward a reflector

420 — Redirect the beam of light toward a light gate, the light gate having an opening that permits the beam of light to travel toward a light sensor 430 — Receive a portion of the beam of light 440 — Convert the portion of the beam of light to a signal 450 — Determine, based on the signal, whether an amount of a shift in a position of a wafer notch satisfies a notch shift threshold

FIG. 4

WAFER NOTCH POSITIONING DETECTION

RELATED APPLICATIONS

This application is a continuation of U.S. patent application Ser. No. 18/060,981, filed Dec. 2, 2022, which is a continuation of U.S. patent application Ser. No. 16/947,850, filed Aug. 20, 2020 (now U.S. Pat. No. 11,521,882), the contents of which are incorporated herein by reference in their entireties.

BACKGROUND

A semiconductor wafer is typically a round or circular structure on which semiconductor devices, such as transistors, memory devices, and/or the like, may be fabricated. A small notch may be cut or formed in a semiconductor wafer to facilitate positioning of the semiconductor wafer in a repeatable manner during each step of a processing flow. For example, the semiconductor wafer can be positioned or oriented with respect to a notch in order to ensure that the semiconductor wafer is in a desired position for each step of the processing flow.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a flowchart of an example process relating to wafer notch positioning detection as described herein.

DETAILED DESCRIPTION

Figure 1A:
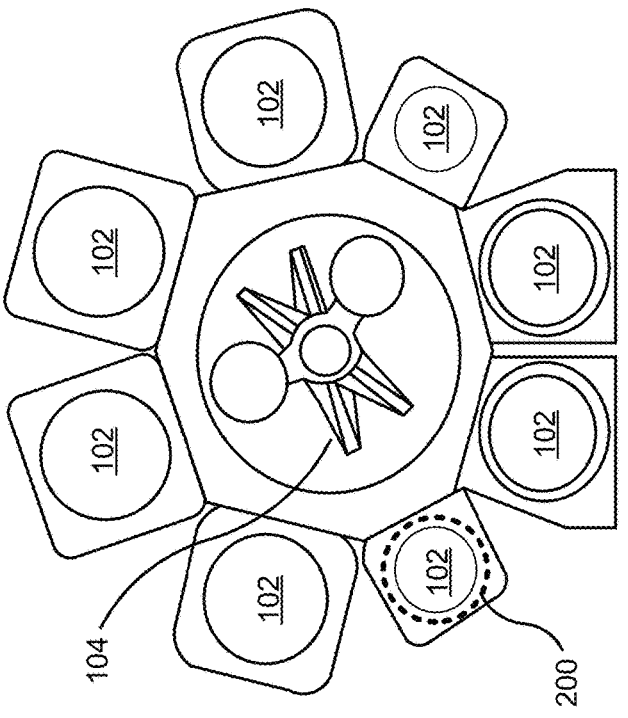
FIGS. 1A and 1B are diagrams of example semiconductor processing tool configurations in which systems, devices, and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, a notch may be cut or formed in a semiconductor wafer to facilitate positioning of the semiconductor wafer in a repeatable manner during a processing flow. However, during a processing flow, the positioning of the semiconductor wafer is typically performed first, after which the semiconductor wafer is transferred to one or more processing chambers. During this processing flow, the position of the semiconductor wafer may shift (such that the notch is shifted from an initial position). Such a shift may be caused by, for example, an orienting error by a semiconductor processing tool, a shake or vibration of a mechanism associated with transferring the semiconductor wafer among processing chambers, a lack of friction between the semiconductor wafer and a surface on which the semiconductor wafer is carried, a vibration of a processing chamber, an instability of a process gas flow, among other examples.

To determine whether a semiconductor wafer has shifted, a position of a semiconductor wafer can in some cases be inspected based on a notch in the semiconductor wafer and using an image sensor-based technique. According to such a technique, an image sensor may capture an image of a portion of a semiconductor wafer. The image sensor may provide information associated with the image to a processing device. The processing device may process and/or analyze the information using one or more techniques (e.g., gray scale analysis, red-green-blue (RGB) splitting, and/or the like) to determine whether the notch is present and/or whether the notch, and therefore the semiconductor wafer, is in the correct position.

However, image sensor-based processing is a complex process that involves high-end processing hardware. Moreover, image sensor-based processing is susceptible to interference based on lighting conditions in different semiconductor processing tools. As a result, image sensor-based processing for notch positioning detection is prone to a high failure rate and, therefore, is applicable to a limited range of semiconductor processes. Further, image sensor-based processing for notch positioning may result in false-positive detections, where a semiconductor wafer is determined to be in the correct position and/or alignment when the semiconductor wafer is actually out of position and/or mis-aligned. This can result in decreased semiconductor wafer yield, increased semiconductor wafer scrap, and/or the like.

Some implementations described herein provide techniques and apparatuses for wafer notch positioning detection using a beam of light (e.g., a laser beam) for detecting the position of a semiconductor wafer notch (rather than image sensor-based notch positioning detection). In some implementations, a position detection device includes a light source to provide a beam of light, a reflector to receive and redirect the beam of light, and a light gate having an opening to permit the beam of light to travel through the opening. The position detection device may include a light sensor to receive a portion of the beam of light after the beam of light travels through the opening, and to convert the portion of the beam of light to a signal. The position detection device may further include a processing device to determine, based on the signal, whether an amount of a shift in a position of the notch satisfies a notch shift threshold, whether the notch is in an allowable position, and/or the like. Additional details are described below.

The use of a beam of light to detect the position of a wafer notch is less susceptible to lighting conditions than other notch detection techniques, such as the image sensor-based position detection technique described above. This permits the position detection device to be used across a more diverse range of semiconductor manufacturing processes. Moreover, this reduces detection errors and reduces false-positives (e.g., reduces the likelihood that a notch is erroneously detected as being in the correct position when the notch actually is not). In addition, the position detection device that uses the beam of light to detect the position of the notch is less complex and requires less processing and memory resources than other notch detection techniques.

Figure 1B:
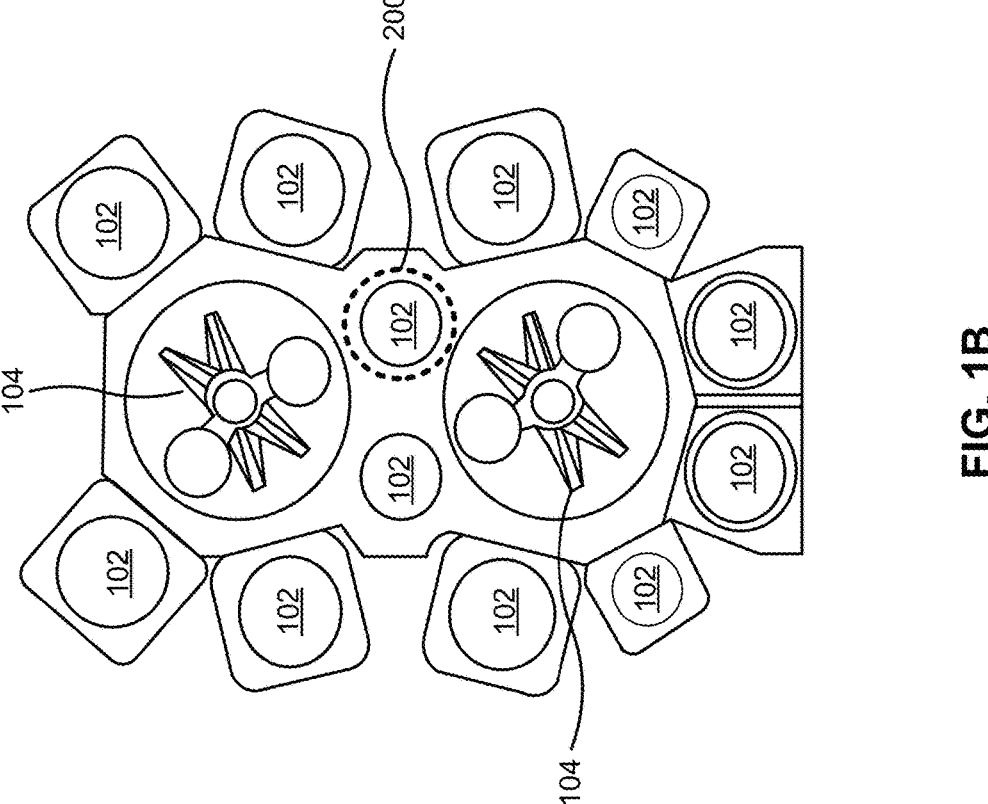

FIGS. 1A and 1B are diagrams of example semiconductor processing tool configurations 100 and 150, respectively, in which systems, devices, and/or methods described herein may be implemented. As shown in FIGS. 1A and 1B, the semiconductor processing tool configuration 100 and the semiconductor processing tool configuration 150 may include a group of semiconductor processing chambers 102 and a handler device 104. In some implementations, the semiconductor processing chambers 102 of the semiconductor processing tool configurations 100 and 150 may be used to perform one or more processing techniques on a wafer comprising a semiconductor device. Such processing techniques may include, for example, forming one or more layers of the semiconductor device, removing portions of one or more layers of the semiconductor device, preparing the semiconductor device for one or more processing layers, and/or the like.

A semiconductor processing chamber 102 may be used to perform a processing technique on a wafer comprising a semiconductor device. A given semiconductor processing chamber 102 may be, for example, a load-lock chamber, an orienting chamber, a cool down chamber, an expansion chamber, a pre-clean chamber, a degas chamber, a high bottom coverage chamber, a deposition chamber (e.g., a physical vapor deposition (PVD) chamber, a chemical vapor deposition (CVD) chamber, and/or the like), a rapid thermal anneal (RTA) chamber, and/or another type of semiconductor processing chamber. In some implementations, the semiconductor processing tool configuration 100 and/or the semiconductor processing tool configuration 150 may include one or more of a given type of the above-mentioned semiconductor processing chambers 102.

Handler device 104 includes a device associated with transferring, carrying, or moving a wafer to and/or between one or more of the aforementioned semiconductor processing chambers 102. For example, handler device 104 may include a robotic arm, a group of robotic arms, and/or the like. The arrangements of the semiconductor processing chambers 102 in the semiconductor processing tool configuration 100 shown in FIG. 1A and the semiconductor processing tool configuration 150 shown in FIG. 1B are for explanatory purposes. One or more of the semiconductor processing chambers 102 in either semiconductor processing tool configuration 100 or 150 may be differently arranged, one or more of the semiconductor processing chambers 102 may be spaced apart from other semiconductor processing chambers 102 (e.g., semiconductor processing chambers 102 may be spaced apart and the handler device 110 may be a robot that transports a wafer to and/or from the spaced-apart semiconductor processing chambers 102), and/or the like. Moreover, the semiconductor processing chambers 102 included in the semiconductor processing tool configurations 100 and 150 illustrated in FIGS. 1A and 1B may be used in conjunction with other semiconductor processing tools and/or chambers to further prepare and/or process a semiconductor device, such as an etch tool, a photoresist tool.

As further shown in FIGS. 1A and 1B, the semiconductor processing tool configuration 100 and the semiconductor processing tool configuration 150 may further include an optical system associated with determining information relating to a position of the wafer. For example, the optical system (herein referred to as a position detection device 200) may determine whether an amount of a shift in a position of the notch satisfies a notch shift threshold, whether the notch is in an allowable position, and/or the like, as described in further detail below. In some implementations, as indicated in FIGS. 1A and 1B, the position detection device 200 may be arranged on, in, or near one of the semiconductor processing chambers 102. For example, the position detection device 200 may arranged on, in, or near a cool down chamber of the semiconductor processing tool configuration 100 or the semiconductor processing tool configuration 150.

As indicated above, FIGS. 1A and 1B are provided merely as examples. Other examples may differ from what is described with regard to FIGS. 1A and 1B.

Figure 2A:
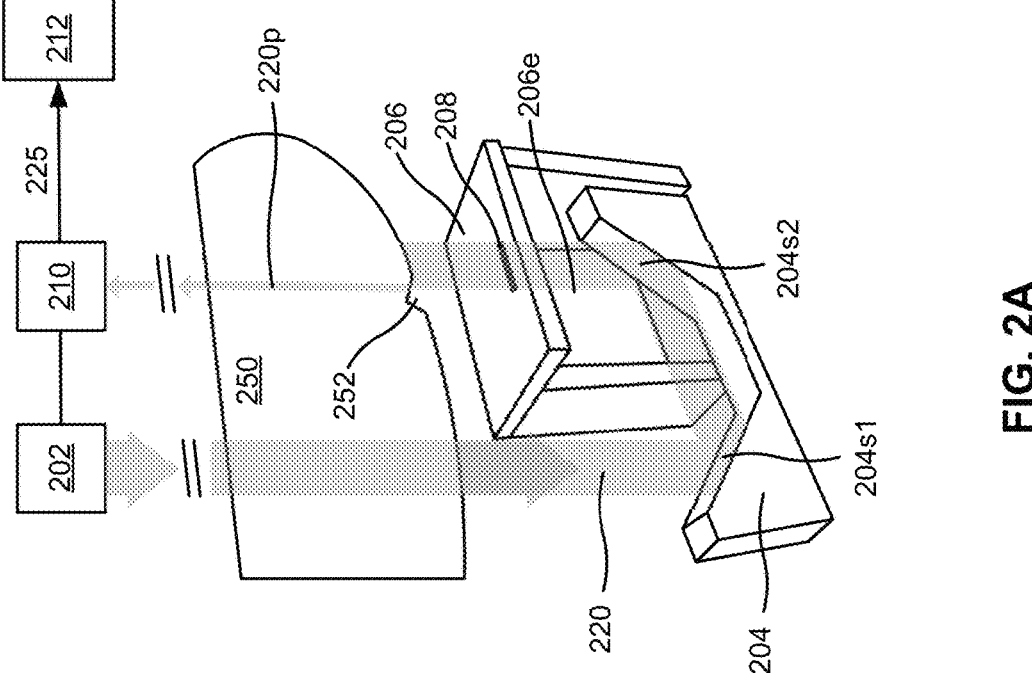
FIGS. 2A-2D are diagrams associated with an example implementation of a position detection device for performing wafer notch positioning detection as described herein.

FIGS. 2A-2D are diagrams associated with an example implementation of a position detection device 200 for performing wafer notch positioning detection as described herein. As shown in FIG. 2A, position detection device 200 may include a light source 202, a reflector 204, a light gate 206 including an opening 208, a light sensor 210, and a processing device 212. In some implementations, as noted above, the position detection device 200 may be capable of determining whether an amount of a shift in a position of a notch 252 of a wafer 250 satisfies a notch shift threshold, whether the notch 252 is in an allowable position, and/or the like.

The components of position detection device 200 are described below, followed by a description of an example operation of position detection device 200.

The light source 202 includes a component to provide a beam of light 220. For example, the light source 202 may include an emitter such as a laser, a light emitting diode (LED), and/or the like. In some implementations, as indicated in FIG. 2A, the light source 202 may be arranged to provide the beam of light 220 toward reflector 204.

Figures 2B, 2C:
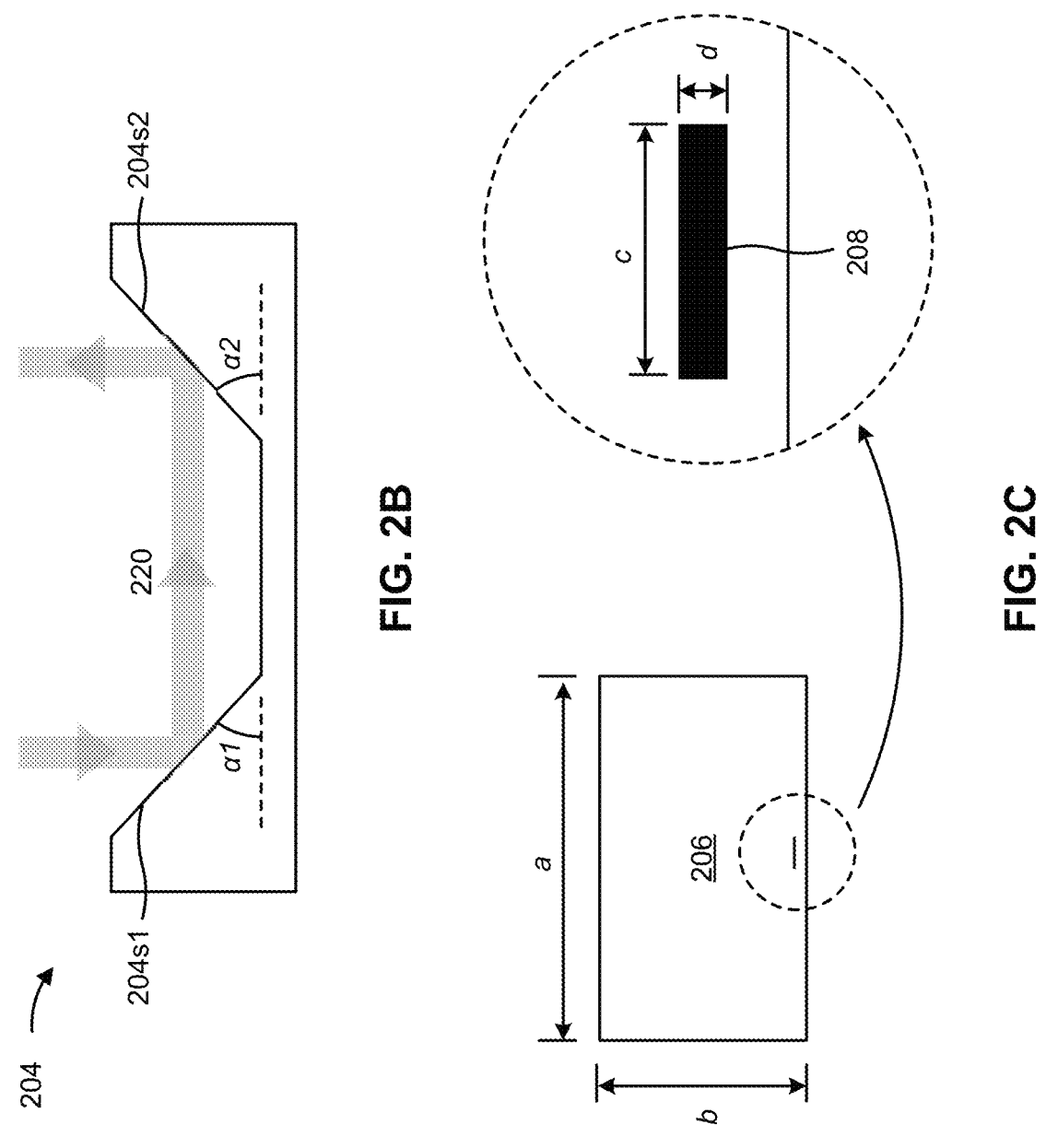

The reflector 204 includes a component to redirect the beam of light 220 (e.g., toward light gate 206). In some implementations, the light source 202 includes one or more reflective surfaces 204s to redirect the beam of light 220. As a particular example, as shown in FIG. 2B, the position detection device 200 may include a first surface 204s1 (e.g., a first mirror) and a second surface 204s2 (e.g., a second mirror), which are angled with respect to an axis (e.g., a horizontal axis) by angles α1 and α2, respectively. As shown, the reflector 204 may be arranged so as to redirect the beam of light 220 by reflecting the beam of light 220 from the first surface 204s1 toward the second surface 204s2, and then reflecting the beam of light 220 from the second surface 204s2 toward the opening 208 of the light gate 206. In some implementations, angles α1 and α2 are the same angle. In some implementations, angles α1 and α2 are different angles. Whether angles α1 and α2 are the same angle or different angles may depend on the arrangement of components of position detection device 200. Notably, while the reflector 204 shown in FIGS. 2A and 2B includes two reflective surfaces 204s, in other implementations, the reflector 204 may include a different number of reflective surfaces 204*s* (e.g., one reflective surface 204*s*, three or more reflective surfaces 204*s*, and/or the like) depending on the arrangement of components of position detection device 200.

Returning to FIG. 2A, the light gate 206 includes a device to permit the beam of light 220 to travel toward the light sensor 210. For example, the light gate 206 may include an opening 208 to permit the beam of light 220 to propagate toward the light sensor 210. In some implementations, the opening 208 may act to filter out divergent light from the beam of light 220.

FIG. 2C is a diagram illustrating a plan view of an example top surface of light gate 206. As shown in FIG. 2C, the light gate 206 may have a length a and a width b. In some implementations, the length a and the width b may be on the order of tens of millimeters (mm). For example, the length a may be approximately 24 mm and the width b may be approximately 40 mm, in some implementations. As further shown in FIG. 2C, the opening 208 may have a length c and a width d, where the length c is less than the length a and the width d is less than the width b. In some implementations, the length c and the width d may be on the other order of millimeters or micrometers. Notably, while the light gate 206 shown in FIGS. 2A and 2C includes one opening 208, in other implementations, the light gate 206 may include two or more openings 208. In some implementations, a size of the opening 208 (e.g., the length c) may be greater than or equal to a size of the notch 252. For example, the length c may be greater than or equal to a width of a widest portion of the notch 252. In some implementations, the size of the opening 208 corresponds to a range of allowable positions of the notch 252, as described below.

Returning to FIG. 2A, in some implementations, the light gate 206 may include a partial enclosure 206*c*. The partial enclosure 206*e* may serve to prevent the opening 208 from permitting unwanted light (e.g., ambient light) to travel toward light sensor 210.

The light sensor 210 includes a component to convert a portion 220*p* of the beam of light 220 to a signal 225 (e.g., an electrical signal). For example, the light sensor 210 may include one or more photodiodes (e.g., an array of photodiodes) capable of converting light, incident thereon, into an electrical current. The portion 220*p* of the beam of light 220 is a portion of the beam of light 220 that reaches (e.g., is incident on) the light sensor 210 after the beam of light 220 travels through the opening 208. The portion 220*p* of the beam of light 220 is defined herein to include the entirety of the beam of light 220, some portion of the beam of light 220 that is less than the entirety of the beam of light 220, or none of the beam of light 220. In some implementations, the light sensor 210 converts the portion 220*p* of the beam of light 220 to the signal 225 such that a value of a characteristic of the signal 225 (e.g., a current, a voltage, and/or the like) corresponds to an intensity of the portion 220*p* of the beam of light 220. Therefore, in some implementations, the characteristic of the signal 225 may be indicative of the intensity of the portion 220*p* of the beam of light 220. In some implementations, as shown in FIG. 2A, the light sensor 210 may be arranged to receive the portion 220*p* of the beam of light 220 after the beam of light 220 travels through the opening 208.

The processing device 212 includes a component to determine positional information, associated with the notch 252 of the wafer 250, based on the signal 225. For example, the processing device 212 may be capable of determining, based on the signal 225, whether the notch 252 of the wafer

250 is in an allowable position. As another example, the processing device 212 may be capable of determining, based on the signal 225, whether an amount of a shift in a position of the notch 252 (e.g., a deviation from a position of the notch 252 after orientation of the wafer 250) satisfies a notch shift threshold.

In some implementations, the processing device 212 may determine the positional information based on the signal 225. For example, a value of a characteristic (e.g., a voltage, a current) of the signal 225 may depend on an intensity of the portion 220*p* of the beam of light 220 incident on the light sensor 210, as described above. Therefore, a comparatively larger portion 220*p* of the beam of light 220 results in a larger value of the characteristic of the signal 225, while a comparatively smaller portion 220*p* of the beam of light 220 results in a comparatively smaller value of the characteristic of the signal 225. Here, the processing device 212 may determine whether the value of the characteristic (e.g., a voltage level that corresponds to the intensity of the portion 220*p* of the beam of light 220) is satisfies a threshold value. If the value is greater than or equal to the threshold value (indicating that the notch 252 is substantially over the opening 208), then the processing device 212 may determine that the notch 252 is in an allowable position and/or that an amount of a shift in a position of the notch 252 satisfies a notch shift threshold. Conversely, if the value is less than the threshold value (indicating that the notch 252 is not substantially over the opening 208), then the processing device 212 may determine that the notch 252 is not in an allowable position and/or that an amount of a shift in a position of the notch 252 does not satisfy a notch shift threshold.

Figure 2D:
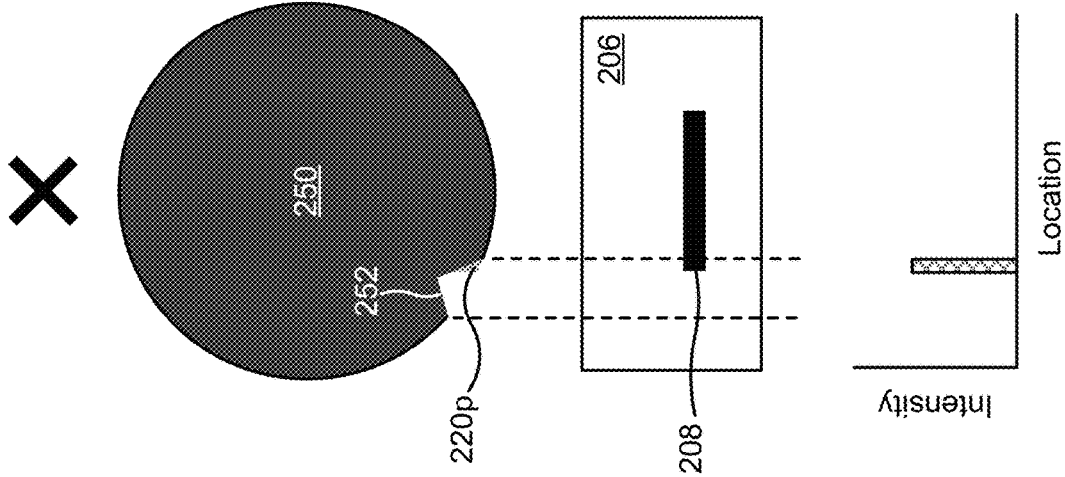
Figure 2D:
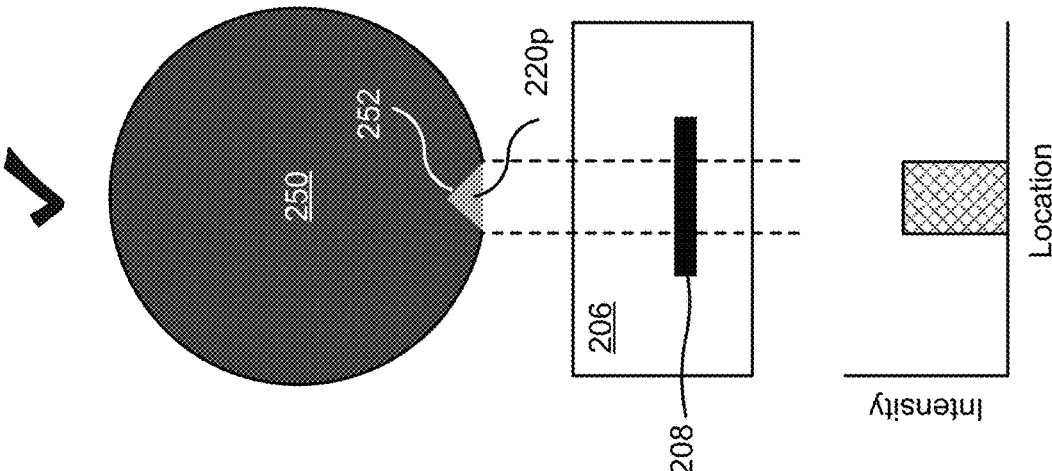

FIG. 2D includes example diagrams illustrating this concept. In the left portion of FIG. 2D, the notch 252 is substantially over the opening 208 (e.g., a length of the notch 252 is entirely within the length c of the opening 208. This means that a comparatively larger portion 220*p* of the beam of light 220 travels through the notch 252. Thus, the intensity of the portion 220*p* is comparatively higher at the light sensor 210 (as indicated by the bottom diagrams in FIG. 2D). As a result, the value of the characteristic of the signal 225 may be greater than or equal to the threshold value, and so processing device 212 may determine that the notch 252 is in an allowable position and/or that an amount of a shift in a position of the notch 252 satisfies a notch shift threshold. Conversely, in the right portion of FIG. 2D, the notch 252 is not substantially over the opening 208 (e.g., a length of the notch 252 is largely outside of the length c of the opening 208. This means that a comparatively smaller portion 220*p* of the beam of light 220 travels through the notch 252. Thus, the intensity of the portion 220*p* is comparatively lower at the light sensor 210 (as indicated by the bottom diagrams in FIG. 2D). As a result, the value of the characteristic of the signal 225 may be less than the threshold value, and so processing device 212 may determine that the notch 252 is not in an allowable position and/or that an amount of a shift in a position of the notch 252 does not satisfy a notch shift threshold. Notably, in this example, the size of the opening 208 defines allowable displacement of the notch 252 and/or the notch shift threshold (e.g., from an initial position).

In some implementations, the processing device 212 may provide an indication of whether the notch 252 in the allowable position and/or whether the amount of the shift in the position of the notch 252 satisfies the notch shift threshold. For example, the processing device 212 may trigger an alarm when the processing device 212 determines that the notch 252 is not in the allowable position and/or determines that the amount of the shift in the position of the notch 252 does not satisfy the notch shift threshold.

Additionally, or alternatively, the processing device 212 may cause an action to be performed based on a result of whether the notch 252 in the allowable position and/or whether the amount of the shift in the position of the notch 252 satisfies the notch shift threshold. For example, if the processing device 212 determines that the notch 252 is not in the allowable position or that the amount of the shift in the position of the notch 252 does not satisfy the notch shift threshold, then the processing device 212 may cause an action associated with attempting to save the wafer 250 to be performed. Such actions may include, for example, causing the wafer 250 to be transferred for reworking or repairing, causing lithography alignment marks on the wafer 250 to be adjusted based on the shift of the notch 252, and/or the like. As another example, if the processing device 212 determines that the notch 252 is in the allowable position or that the amount of the shift in the position of the notch 252 satisfies the notch shift threshold, then the processing device 212 may cause the wafer 250 to proceed to a next step in the processing flow (e.g., the processing device 212 may cause the wafer 250 to proceed to a next semiconductor processing tool for further processing).

In operation, the light source 202 provides the beam of light 220 toward the reflector 204. Next, the reflector 204 receives and redirects the beam of light 220 toward the light gate 206. The light gate 206 has the opening 208, which permits the beam of light 220, from the reflector 204, to travel through the opening 208 toward the light sensor 210. The light sensor 210 receives a portion 220p of the beam of light 220 after the beam of light 220 travels through the opening 208 and the notch 252. The light sensor 210 converts the portion 220p of the beam of light 220 to the signal 225, and provides the signal 225 to the processing device 212. The processing device 212 then determines, based on the signal 225, whether the notch 252 of the wafer 250 is in an allowable position and/or whether an amount of a shift in a position of the notch 252 satisfies a notch shift threshold. In some implementations, the processing device 212 provides an indication associated with the result of the determination, triggers an alarm based on the result of the determination, and/or causes an action to be performed based on the result of the determination, as described above.

As indicated above, FIGS. 2A-2D are provided merely examples. Other examples may differ from what is described with regard to FIGS. 2A-2D.

Figure 3:
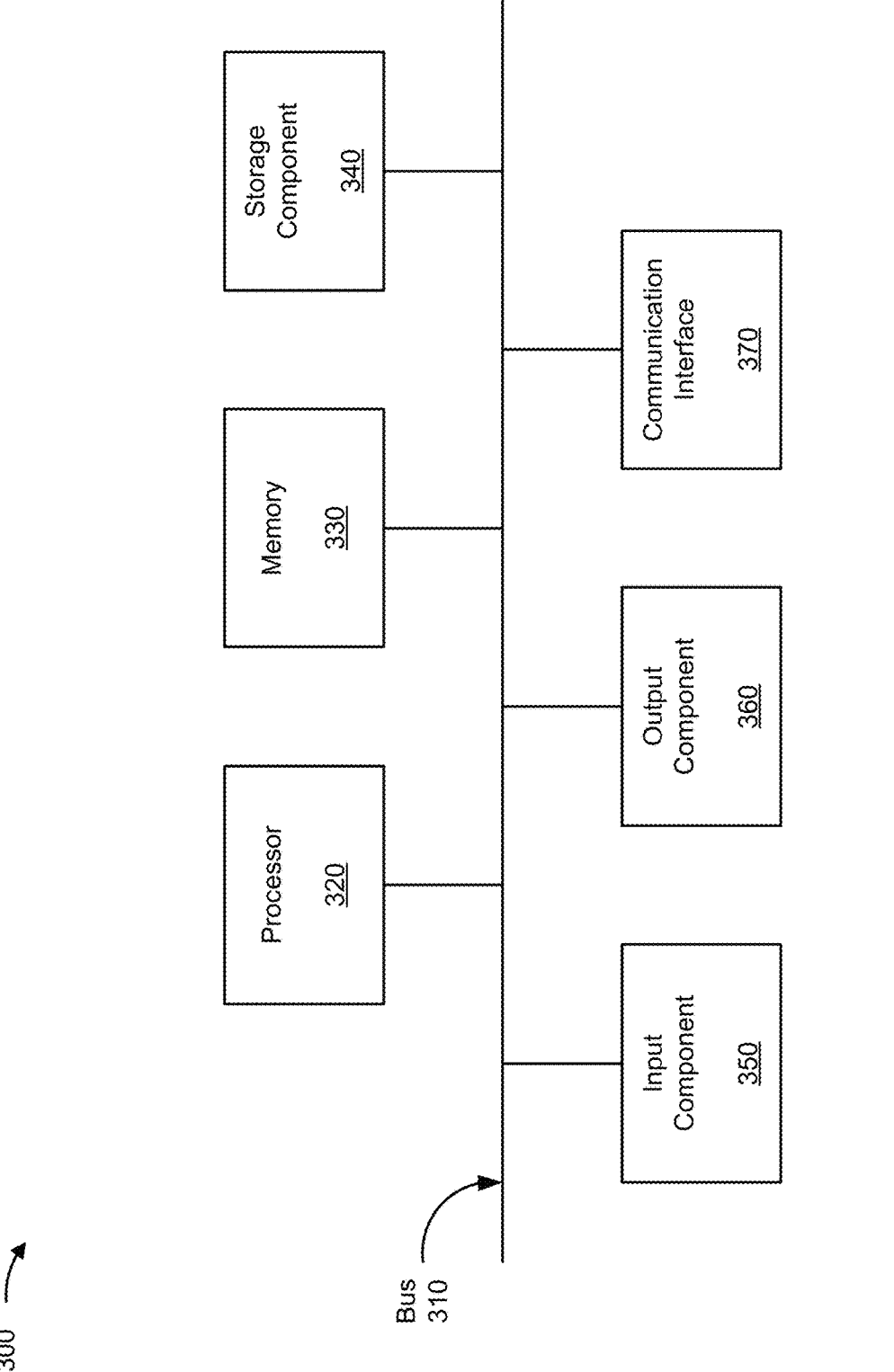
FIG. 3 is a diagram of example components of one or more devices described herein.

FIG. 3 is a diagram of example components of a device 300. In some implementations, a semiconductor processing chamber 102, a handler device 110, a light source 202, a light sensor 210, and/or a processing device 212 may include one or more devices 300 and/or one or more components of device 300.

As shown in FIG. 3, device 300 may include a bus 310, a processor 320, a memory 330, a storage component 340, an input component 350, an output component 360, and a communication component 370.

Bus 310 includes a component that enables wired and/or wireless communication among the components of device 300. Processor 320 includes a central processing unit, a graphics processing unit, a microprocessor, a controller, a microcontroller, a digital signal processor, a field-programmable gate array, an application-specific integrated circuit, and/or another type of processing component. Processor 320 is implemented in hardware, firmware, or a combination of hardware and software. In some implementations, processor 320 includes one or more processors capable of being programmed to perform a function. Memory 330 includes a random access memory, a read only memory, and/or another type of memory (e.g., a flash memory, a magnetic memory, and/or an optical memory).

Storage component 340 stores information and/or software related to the operation of device 300. For example, storage component 340 may include a hard disk drive, a magnetic disk drive, an optical disk drive, a solid state disk drive, a compact disc, a digital versatile disc, and/or another type of non-transitory computer-readable medium. Input component 350 enables device 300 to receive input, such as user input and/or sensed inputs. For example, input component 350 may include a touch screen, a keyboard, a keypad, a mouse, a button, a microphone, a switch, a sensor, a global positioning system component, an accelerometer, a gyroscope, an actuator, and/or the like. Output component 360 enables device 300 to provide output, such as via a display, a speaker, and/or one or more light-emitting diodes. Communication component 370 enables device 300 to communicate with other devices, such as via a wired connection and/or a wireless connection. For example, communication component 370 may include a receiver, a transmitter, a transceiver, a modem, a network interface card, an antenna, and/or the like.

Device 300 may perform one or more processes described herein. For example, a non-transitory computer-readable medium (e.g., memory 330 and/or storage component 340) may store a set of instructions (e.g., one or more instructions, code, software code, program code, and/or the like) for execution by processor 320. Processor 320 may execute the set of instructions to perform one or more processes described herein. In some implementations, execution of the set of instructions, by one or more processors 320, causes the one or more processors 320 and/or the device 300 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 3 are provided as an example. Device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

FIG. 4 is a flowchart of an example process 400 relating to wafer notch positioning detection as described herein. In some implementations, one or more process blocks of FIG. 4 may be performed by a position detection device (e.g., position detection device 200). Additionally, or alternatively, one or more process blocks of FIG. 4 may be performed by one or more components of a device 300, such as processor 320, memory 330, storage component 340, input component 350, output component 360, communication component 370, and/or the like.

As shown in FIG. 4, process 400 may include providing a beam of light toward a reflector (block 410). For example, a light source 202 of the position detection device 200 may provide a beam of light 220 toward a reflector 204 of the position detection device 200, as described above.

As further shown in FIG. 4, process 400 may include redirecting the beam of light toward a light gate, the light gate having an opening that permits the beam of light to travel toward a light sensor (block 420). For example, the reflector 204 of the position detection device 200 may redirect the beam of light 220 toward a light gate 206 of the position detection device 200, the light gate 206 having an opening 208 that permits the beam of light 220 to travel toward a light sensor 210 of the position detection device 200, as described above.

As further shown in FIG. 4, process 400 may include receiving a portion of the beam of light (block 430). For example, the light sensor 210 of the position detection device 200 may receive a portion 220$p$ of the beam of light 220, as described above.

As further shown in FIG. 4, process 400 may include converting the portion of the beam of light to a signal (block 440). For example, the light sensor 210 of the position detection device 200 may convert the portion 220$p$ of the beam of light 220 to a signal 225, as described above.

As further shown in FIG. 4, process 400 may include determining, based on the signal, whether an amount of a shift in a position of a wafer notch satisfies a notch shift threshold (block 450). For example, the processing device 212 of the position detection device 200 may determine, based on the signal 225, whether an amount of a shift in a position of a wafer notch 252 of a wafer 250 (e.g., a semiconductor wafer) satisfies a notch shift threshold, as described above.

Process 400 may include additional implementations, such as any single implementation or any combination of implementations described below and/or in connection with one or more other processes described elsewhere herein.

In some implementations, process 400 includes filtering, by the opening 208 of the light gate 206, divergent light from the beam of light 220 in association with permitting the beam of light 220 to travel toward the light sensor 210.

In some implementations, redirecting the beam of light 220 toward the light gate 206 includes reflecting, by a first surface 204$s1$ of the reflector 204, the beam of light 220 toward a second surface 204$s2$ of the reflector 204, and reflecting, by the second surface 204$s2$ of the reflector 204, the beam of light 220 toward the opening 208.

In some implementations, a value of a characteristic of the signal 225 is dependent on an intensity of the portion 220$p$ of the beam of light 220.

In some implementations, process 400 includes providing (e.g., by the processing device 212) an indication of a result of determining whether the amount of the shift in the position of the wafer notch 252 satisfies the notch shift threshold.

In some implementations, process 400 includes triggering (e.g., by the processing device 212) an alarm when a result of determining whether the amount of the shift in the position of the wafer notch 252 satisfies the notch shift threshold is that the amount of the shift in the position of the wafer notch 252 does not satisfy the notch shift threshold.

In some implementations, the light gate 206 comprises a partial enclosure 206$c$.

In some implementations, a size of the opening 208 is greater than or equal to a size of the wafer notch 252. In some implementations, a size of the opening 208 corresponds to a range of allowable positions of the wafer notch 252.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

In this way, wafer notch positioning detection can be performed by a position detection device that uses a beam of light. For example, a position detection device 200 may include a light source 202 to provide a beam of light 220, a reflector 204 to receive and redirect the beam of light 220, and a light gate 206 having an opening 208 to permit the beam of light 220 to travel through the opening 208. The position detection device 200 may further include a light sensor 210 to receive a portion 220$p$ of the beam of light 220 after the beam of light 220 travels through the opening 208, and to convert the portion 220$p$ of the beam of light 220 to a signal 225. The position detection device 200 may further include a processing device 212 to determine, based on the signal 225, whether an amount of a shift in a position of the notch 252 satisfies a notch shift threshold, whether the notch 252 is in an allowable position, and/or the like.

Notably, operation of position detection device 200 is less susceptible to lighting conditions than other notch detection techniques, such as the image sensor-based position detection technique described above. This permits the position detection device 200 to be used across a more diverse range of semiconductor manufacturing processes. Moreover, the position detection device 200 reduces detection errors and reduces false-positives (e.g., reduces the likelihood that a notch is erroneously detected as being in the correct position when the notch actually is not). In addition, the position detection device 200 is less complex and requires less processing and memory resources than other notch detection techniques.

As described in greater detail above, some implementations described herein provide an optical system, a method, and position detection device associated with performing wafer notch positioning detection.

In some implementations, the optical system includes a light source to provide a beam of light, a reflector to receive and redirect the beam of light, and a light gate having an opening to permit the beam of light, from the reflector, to travel through the opening. In some implementations, the optical system includes a light sensor to receive a portion of the beam of light after the beam of light travels through the opening, and convert the portion of the beam of light to a signal. In some implementations, the optical system includes a processing device to determine whether a notch of a wafer is in an allowable position based on the signal.

In some implementations, the method includes providing, by a light source, a beam of light toward a reflector. In some implementations, the method includes redirecting, by the reflector, the beam of light toward a light gate, the light gate having an opening that permits the beam of light to travel toward a light sensor. In some implementations, the method includes receiving, by the light sensor, a portion of the beam of light and converting, by the light sensor, the portion of the beam of light to a signal. In some implementations, the method includes determining, by a processing device and based on the signal, whether an amount of a shift in a position of a wafer notch satisfies a notch shift threshold.

In some implementations, the position detection device includes a reflector to redirect a beam of light. In some implementations, the position detection device includes a light gate comprising a partial enclosure and having one or more openings to permit the beam of light, from the reflector, to travel through an opening of the one or more openings. In some implementations, the position detection device includes a light sensor to convert a portion of the beam of light, received from the opening of the light gate, to a signal. In some implementations, the position detection device includes a processing device to detect, based on the signal, whether a notch of a wafer is in an allowable position.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a reflector to direct a beam of light;
a light gate comprising one or more openings to receive at least a portion of the beam of light; and
a processing device to determine, based on a signal associated with the at least the portion of the beam of light, whether a notch of a wafer is in an allowable position and whether an amount of a shift in a position of the notch of the wafer satisfies a notch shift threshold.

2. The device of claim 1, further comprising:
a light source configured to generate the beam of light.

3. The device of claim 1,
wherein the one or more openings comprises a single opening.

4. The device of claim 3,
wherein a size of the single opening is greater than a size of the notch.

5. The device of claim 3,
wherein a size of the single opening corresponds to a range of allowance positions of the notch.

6. The device of claim 1,
wherein the one or more openings comprises a plurality of openings.

7. A device, comprising:
a reflector to direct a beam of light;
a light gate comprising one or more openings to receive at least a portion of the beam of light;
a light sensor configured to convert the at least the portion of the beam of light into a signal; and
a processing device to determine, based on the signal, whether a notch of a wafer is in an allowable position and whether an amount of a shift in a position of the notch of the wafer satisfies a notch shift threshold.

8. The device of claim 7,
wherein the amount of the shift in the position of the notch relates to a deviation from the position of the notch after orientation of the wafer.

9. The device of claim 7,
wherein, to determine whether the notch of the wafer is in the allowable position and whether the amount of the shift in the position of the notch of the wafer satisfies the notch shift threshold, the processing device is configured to determine, based on a value of a characteristic of the signal, whether the notch of the wafer is in the allowable position and whether the amount of the shift in the position of the notch of the wafer satisfies the notch shift threshold.

10. The device of claim 9,
wherein the value of the characteristic of the signal corresponds to an amount of the portion of light received in the one or more openings of the light gate.

11. The device of claim 9,
wherein the value of the characteristic of the signal corresponds to an intensity of the portion of the beam of light.

12. The device of claim 9,
wherein, to determine whether the notch of the wafer is in the allowable position and whether the amount of the shift in the position of the notch of the wafer satisfies the notch shift threshold, the processing device is configured to:
determine, based on whether the value of the characteristic of the signal satisfies a second threshold, whether the notch of the wafer is in the allowable position and whether the amount of the shift in the position of the notch of the wafer satisfies the notch shift threshold.

13. The device of claim 7,
wherein, to determine whether the notch of the wafer is in the allowable position and whether the amount of the shift in the position of the notch of the wafer satisfies the notch shift threshold, the processing device is configured to:
determine, based on the signal, positional information associated with the notch of the wafer, and
determine, based on the positional information, whether the notch of the wafer is in the allowable position and whether the amount of the shift in the position of the notch of the wafer satisfies the notch shift threshold.

14. A method, comprising:
directing, by a reflector, a beam of light toward one or more openings of a light gate;
receiving, by a light sensor, at least a portion of the beam of light;
converting, by the light sensor, the at least the portion of the beam of light to a signal; and
determining, by a processing device and based on the signal, whether a notch of a wafer is in an allowable position and whether an amount of a shift in a position of the notch of the wafer satisfies a notch shift threshold.

15. The method of claim 14, further comprising:
performing an action associated with the at least one of:
whether the notch of the wafer is in the allowable position, or
whether the amount of the shift in the position of the notch of the wafer satisfies the notch shift threshold.

16. The method of claim 15,
wherein performing the action comprises:
providing an indication of the at least one of:
whether the notch of the wafer is in the allowable position, or
whether the amount of the shift in the position of the notch of the wafer satisfies the notch shift threshold.

17. The method of claim 16,
wherein the indication is an alarm.

18. The method of claim 16, wherein:
the indication comprises at least one of:
the notch of the wafer not being in the allowable position, or
the amount of the shift in the position of the notch of the wafer not satisfying the notch shift threshold, and
the action is associated with the wafer.

19. The method of claim 15, wherein the action comprises:

causing the wafer to be transferred for reworking or repairing, and causing lithography alignment marks on the wafer to be adjusted based on the shift of the notch.

20. The method of claim 14, further comprising:

determining whether to cause the wafer to proceed to a next semiconductor processing tool for further processing based on whether the notch of the wafer is in the allowable position and whether the amount of the shift in the position of the notch of the wafer satisfies the notch shift threshold.

\* \* \* \* \*